(12) United States Patent
Lu et al.

(10) Patent No.: US 10,629,479 B2
(45) Date of Patent: Apr. 21, 2020

(54) STRUCTURE AND METHOD FOR INTERCONNECTION

(71) Applicant: Taiwan Semiconductor Manufacturing Company, Ltd., Hsin-Chu (TW)

(72) Inventors: Chih Wei Lu, Hsinchu (TW); Chung-Ju Lee, Hsinchu (TW); Tien-I Bao, Taiyuan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/409,218

(22) Filed: May 10, 2019

(65) Prior Publication Data
US 2019/0341299 A1    Nov. 7, 2019

Related U.S. Application Data

(60) Continuation of application No. 15/634,778, filed on Jun. 27, 2017, now Pat. No. 10,290,536, which is a
(Continued)

(51) Int. Cl.
*H01L 21/768* (2006.01)
*H01L 23/528* (2006.01)
(Continued)

(52) U.S. Cl.
CPC .... *H01L 21/76811* (2013.01); *H01L 21/7684* (2013.01); *H01L 21/76807* (2013.01);
(Continued)

(58) Field of Classification Search
CPC ............ H01L 21/768; H01L 21/76811; H01L 21/76807; H01L 21/76813;
(Continued)

(56) References Cited

U.S. PATENT DOCUMENTS 7,667,271 B2    2/2010 Yu et al.
7,910,453 B2    3/2011 Xu et al.
(Continued)

FOREIGN PATENT DOCUMENTS

CN    1434509 A    8/2013

*Primary Examiner* — Chuong A Luu
(74) *Attorney, Agent, or Firm* — Haynes and Boone, LLP

(57) ABSTRACT

Various self-aligned interconnect structures are disclosed herein. An exemplary interconnect structure includes a first dielectric layer disposed over a substrate; a first conductive feature disposed in the first dielectric layer; an etch stop layer disposed over a top surface of the first dielectric layer and a top surface of the first conductive feature; a second dielectric layer disposed over the first dielectric layer; and a second conductive feature disposed in the second dielectric layer. The top surface of the first conductive feature is lower than the top surface of the first dielectric layer. The etch stop layer includes a portion that extends between the top surface of the first conductive feature and the top surface of the first dielectric layer, on which the second conductive feature may or may not be disposed. In some implementations, the second conductive feature may be a via feature.

20 Claims, 5 Drawing Sheets

Related U.S. Application Data division of application No. 14/829,851, filed on Aug. 19, 2015, now Pat. No. 9,698,100.

(51) Int. Cl.
*H01L 23/522* (2006.01)
*H01L 23/532* (2006.01)

(52) U.S. Cl.
CPC .. *H01L 21/76813* (2013.01); *H01L 21/76822* (2013.01); *H01L 21/76829* (2013.01); *H01L 21/76835* (2013.01); *H01L 21/76843* (2013.01); *H01L 21/76871* (2013.01); *H01L 21/76877* (2013.01); *H01L 21/76879* (2013.01); *H01L 21/76883* (2013.01); *H01L 23/528* (2013.01); *H01L 23/5226* (2013.01); *H01L 23/53238* (2013.01); *H01L 23/53295* (2013.01); *H01L 21/76834* (2013.01); *H01L 23/532* (2013.01)

(58) Field of Classification Search
CPC ......... H01L 21/76822; H01L 21/76829; H01L 21/76835; H01L 21/7684; H01L 21/76843; H01L 21/76871; H01L 21/76877; H01L 21/76879; H01L 21/76883; H01L 21/76834
USPC ................................ 438/629, 637, 639, 640
See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2003/0139034 A1 | 7/2003 | Yuang et al. |
| 2006/0035173 A1 | 2/2006 | Davidson et al. |
| 2010/0044869 A1 | 2/2010 | Zhang |
| 2014/0001574 A1 | 1/2014 | Chen et al. |
| 2014/0110755 A1 | 4/2014 | Colinge |
| 2014/0151812 A1 | 6/2014 | Liaw et al. |
| 2015/0091093 A1 | 4/2015 | Bouche et al. |
| 2015/0206804 A1 | 7/2015 | Liou et al. |
| 2015/0270225 A1* | 9/2015 | Yang ................. H01L 23/53276 257/750 |
| 2016/0133512 A1* | 5/2016 | Lee ................... H01L 21/76807 438/666 |
| 2016/0315046 A1* | 10/2016 | Jezewski ........... H01L 21/76879 |

* cited by examiner

STRUCTURE AND METHOD FOR INTERCONNECTION

This application is a continuation application of U.S. patent application Ser. No. 15/634,778, filed Jun. 27, 2017, now U.S. Pat. No. 10,290,536, which is a divisional application of U.S. patent application Ser. No. 14/829,851, filed Aug. 19, 2015, now U.S. Pat. No. 9,698,100, the entire disclosures of which are incorporated herein by reference in their entirety.

BACKGROUND

In semiconductor technology, an integrated circuit pattern can be defined on a substrate using a photolithography process. Dual damascene processes are utilized to form multilayer copper interconnections including vertical interconnection vias/contacts and horizontal interconnection metal lines. During a dual damascene process, a plug filling material is employed to fill in the vias (or contacts) and the material is then polished back. However, the vias (or contacts) are defined by a different lithography process and may cause misalignments between the underlying metal lines and the vias. Especially, when the semiconductor technologies move forward to advanced technology nodes with smaller feature sizes, such as 20 nm, 16 nm or less, the misalignments have less tolerance and may cause short, opening or other issues.

Therefore, the present disclosure provides an interconnection structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
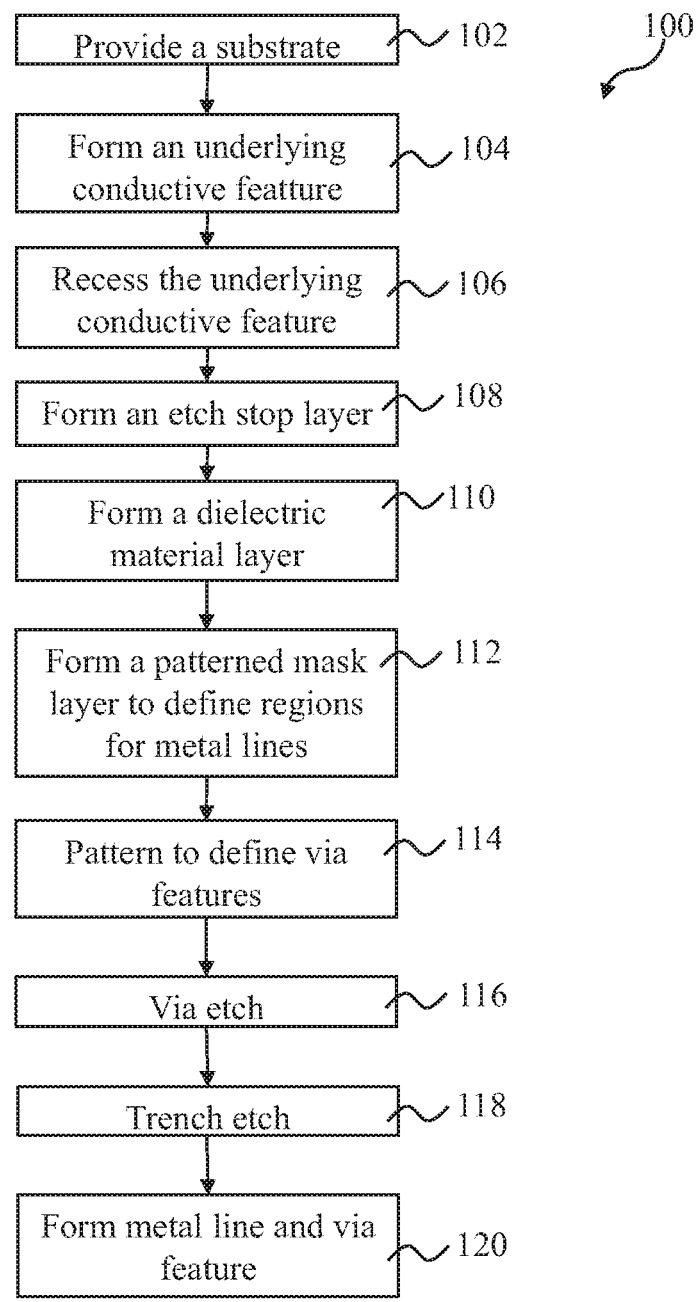
FIG. 1 is a flowchart of one embodiment of a method to form an integrated circuit (IC) structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 to form an integrated circuit according to one or more embodiments of the present invention. FIGS. 2 through 10 illustrate sectional views of an exemplary integrated circuit 200 during various fabrication stages of the method 100. With reference to FIGS. 1 through 10 and other figures, the method 100 and the exemplary integrated circuit (IC) structure 200 are described below.

Figure 2:
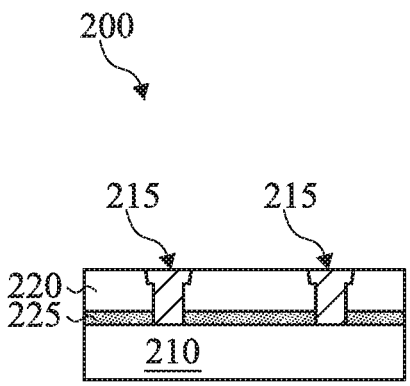
FIGS. 2, 3, 4, 5, 6, 7, 8, 9 and 10 illustrate sectional views of an exemplary integrated circuit structure during various fabrication stages, made by the method of FIG. 1, constructed in accordance with some embodiments.

The method begins at 102 by providing or receiving a substrate 210 as illustrated in FIG. 2. In some embodiments, the substrate 210 includes silicon. Alternatively, the substrate 210 may include other elementary semiconductor such as germanium in accordance with some embodiments. In some embodiments, the substrate 210 additionally or alternatively includes a compound semiconductor such as silicon carbide, gallium arsenic, indium arsenide, and indium phosphide. In some embodiments, the substrate 210 includes an alloy semiconductor such as silicon germanium, silicon germanium carbide, gallium arsenic phosphide, and gallium indium phosphide.

The substrate 210 may include an epitaxial layer formed on the top surface, such as an epitaxial semiconductor layer overlying a bulk semiconductor wafer. In some embodiments, the substrate 210 includes a semiconductor-on-insulator (SOI) structure. For example, the substrate may include a buried oxide (BOX) layer formed by a process such as separation by implanted oxygen (SIMOX). IN various embodiments, the substrate 210 includes various p-type doped regions and/or n-type doped regions, such as p-type wells, n-type wells, p-type source/drain features and/or n-type source/drain features, formed by a process such as ion implantation and/or diffusion. The substrate 210 may include other functional features such as a resistor, a capacitor, diode, transistors, such as field effect transistors (FETs). The substrate 210 may include lateral isolation features configured to separate various devices formed on the substrate 210. The substrate 210 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 210. The multilayer interconnection structure is designed to couple various devices features (such as various p-type and n-type doped regions, gate electrodes and/or passive devices) to form a functional circuit.

Still referring to FIGS. 1 and 2, the method 100 includes an operation 104 by forming one (or more) underlying conductive feature 215 on the substrate 210. In some embodiments, the underlying conductive feature 215 is a doped region, such as a source/drain feature. In some embodiments, the underlying conductive feature 215 is a gate electrode, a capacitor or resist. In some embodiments, the underlying conductive feature 215 is a metal feature, such as a metal line, a via feature or a contact feature. In some embodiments, the underlying conductive feature 215 includes both a metal line and a via feature.

In the present embodiments for description), the underlying conductive feature 215 is a metal line in one metal layer of the MLI structure. In furtherance of the embodiment, the underlying conductive feature 215 is formed in a first dielectric material layer 220.

In some embodiments, the metal line 215 is formed by a damascene process, which is further described below. The first dielectric material layer 220 is formed on the substrate 210. Alternatively, an etch stop layer 225 is formed on the substrate 210 and the first dielectric material layer 220 is formed on the etch stop layer 225. In some embodiments, the first dielectric material layer 220 includes a dielectric material such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SILK (Dow Chemical, Midland, Mich.), polyimide, porous polymer and/or other suitable materials as examples. A process of forming the material layer 220 may utilize chemical vapor deposition (CVD), a spin-on coating or other suitable deposition technology. The etch stop layer 225 includes a material different from the first dielectric material layer 220 designed to provide etch selectivity such that a subsequent etching process is able to substantially etch the first dielectric material layer 220 and stops on the etch stop layer 225. For example, the etch stop layer 225 includes silicon nitride, silicon oxide, silicon oxynitride, silicon carbide or other suitable material that functions to stop the etching of the subsequent etching process. The etch stop layer 225 may be formed by CVD or other suitable technology. After the deposition of (the etch stop layer 225 and) the first dielectric material layer 220, the first dielectric material layer 220 may be further planarized by a technique, such as chemical mechanical polishing (CMP).

Thereafter, the first dielectric material layer 220 is patterned to form one or more trench. The trench may be aligned to expose lower conductive features in the substrate 210 such as metal features in a lower metal layer or alternatively doped regions disposed in the semiconductor material of the substrate 210. In some embodiments, an operation to form the trench utilizes a lithography patterning and etching processes know in the art or by a new technique to be developed in the future. For example, a patterned resist layer is formed on the first dielectric material layer 220 by a lithography process that includes resist coating, exposure and developing. The patterned resist layer includes an opening that defines a region for the trench. An etching process is further applied to the first dielectric material layer 220 through the opening of the patterned resist layer, using the patterned resist layer as an etch mask. After the formation of the trench, the patterned resist layer is removed by wet stripping or plasma ashing. Alternatively, a hard mask may be used such that trench pattern is transferred from the patterned resist layer to the hard mask by a first etch and then transferred to the first dielectric material layer by a second etch.

A conductive material is then filled in the trench to form the underlying conductive feature 215. In various embodiments, the conductive material includes copper, aluminum, cobalt, or tungsten. In some other embodiments, the conductive material may include titanium, polysilicon, metal silicide, metal alloy, or combinations thereof. In the present embodiment, the underlying conductive feature 215 includes copper and has multiple films. In furtherance of the embodiment, the underlying conductive feature 215 includes a barrier layer lining the trench and copper filled in the trench. In one example, the underlying conductive feature 215 is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride or a combination thereof; and may be formed by sputtering. Afterward, a CMP process may be applied to remove excessive copper and planarize the top surface.

Figure 3:
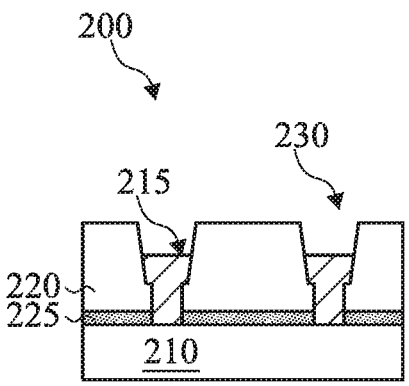

The method 100 proceeds to operation 106 by recessing the underlying conductive feature 215 such that the top surface of the underlying conductive feature 215 is below the top surface of the first dielectric material layer 220, resulting in a recess (or recessed trench) 230 aligned with the underlying conductive feature 215, as illustrated in FIG. 3. The recessed trench has a vertical dimension D comparable to the thickness T of the recessed underlying conductive feature 215. In some examples, the ratio D/T ranges from about 10% to about 90%. In some examples, the ratio D/T ranges from about 20% to about 30%.

In some embodiments, an etching process is applied to etch the underlying conductive feature 215. The etching process is designed with the etchant to selectively remove the underlying conductive feature 215 while the first dielectric material layer 220 remains intact. The etching process can be wet etch, dry etch, or a combination thereof. In the present embodiment, the underlying conductive feature 215 includes copper; and the etching process includes a plasma etch with an etchant that includes CH4, H2 or a combination thereof. The plasma etch may further include a carry gas such as argon (Ar) or nitrogen (N2). In various examples, the plasma etch uses the gas that includes CH4 and Ar; CH4 and N2; H2 and Ar; or H2 and N2. In a particular embodiment, the plasma etch is a reactive ion etch (RIE).

The recessing process applied the underlying conductive feature 215 at the operation 106 may be alternatively replaced by or modified to other proper technique. For example, a self-aligned growth process is applied to the integrated circuit structure 200 such that a dielectric material (same to or different from that of the first dielectric material layer 220) is selectively grown on the first dielectric material layer 220, thereby resulting in the top surface of the underlying conductive feature 215 is recessed from the top surface of the newly grown dielectric material. In other embodiments, the operations 104 and 106 may be collectively modified to other procedure to generate such recess. For example, the trench is created by lithography patterning and etching, and thereafter a conductive material is partially filled in the trench such that recess is automatically generated.

Figure 4:
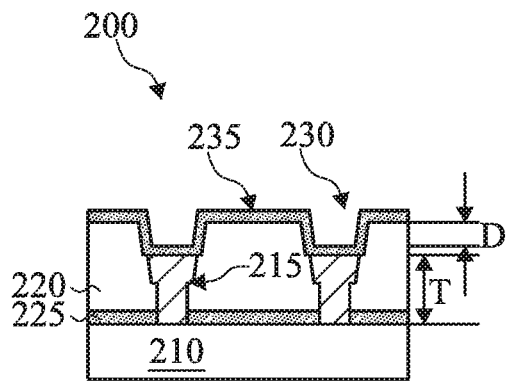

The method 100 proceeds to operation 108 by forming an etch stop layer (ESL) 235 on the IC structure 200, as illustrated in FIG. 4. Particularly, the IC structure 200 has a non-planar top surface since the underlying conductive feature 215 is recessed from the first dielectric material layer 220. The ESL 235 is not planar accordingly. The ESL 235 includes one or more dip portion self-aligned with the underlying conductive feature 215 and the recess 230. Here, self-alignment between the dip portion and the underlying conductive feature is understood as an alignment in a top view toward the substrate 210. In some embodiments, the ESL 235 is conformal to the top surface of the IC structure 200 and the dip portion of the ESL 235 is conformal to the recess 230. In some embodiments, the dip portion of the etch stop layer includes a sidewall portion and a bottom portion, the bottom portion being disposed on the underlying conductive feature; the etch stop layer includes a planar portion disposed on the first dielectric material layer; and the bottom portion has a top surface below than a bottom surface of the planar portion.

Figure 5:
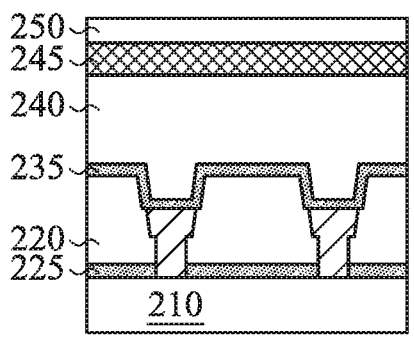

The ESL 235 is designed to provide etch selectivity during subsequent etching and includes a dielectric material different from that of a dielectric material layer (240 in FIG. 5, which is to be formed on the ESL 235). In various embodiments, the ESL 235 includes a dielectric material selected from silicon nitride, silicon oxynitride, silicon carbide, silicon carbon nitride or other dielectric material different from that of the dielectric material layer to be formed. For example, if the dielectric material layer to be formed includes a low-k dielectric material, such as a porous organic material, the ESL 235 may include silicon oxide. The ESL 235 is formed by a proper technique, such as CVD. The ESL 235 includes a thickness enough to resist the subsequent etching process. In some other embodiments, the ESL 235 may include a metal oxide, or a metal nitride. For example, the metal oxide may be TiO2, Al2O3, or other metal oxides. For example, the metal nitride may be titanium nitride (TiN), aluminum nitride (AlN), aluminum oxynitride (AlON), tantalum nitride (TaN), or other metal nitrides.

The method 100 proceeds to operation 110 to form a second dielectric material layer 240 on the IC structure 200, as illustrated in FIG. 5. The second dielectric material layer 240 is formed on the ESL 235. The second dielectric material layer 240 fills in the dip of the ESL 235. In some embodiments, the second dielectric material layer 240 includes silicon oxide, silicon nitride, a low k material, or a combination thereof. The formation of the second dielectric material layer 240 may include CVD, a spin-on coating or other suitable deposition technology. In some embodiments, the second dielectric material layer 240 is similar to the first dielectric material layer 220 in term of composition and deposition. After the deposition of the second dielectric material layer 240, a CMP process may be applied to planarize the top surface of the IC structure 200.

In some embodiments, an anti-reflective coating (ARC) film 245 is further formed on the second dielectric material layer 240 to reduce the reflection during subsequent lithography patterning or additionally provide other functions. In one example, the ARC film 245 includes a nitrogen-free ARC (NFARC) material. NFARC material reduces resist poisoning in sensitive photoresists and may include silicon oxide and may additionally include carbon, such as carbon-doped silicon oxide.

A mask layer 250 is further formed on the IC structure 200. In some embodiments, the mask layer 250 is a resist layer. In some other embodiments, the mask layer 250 includes a hard mask material, such as silicon nitride or silicon oxynitride.

Figure 6:
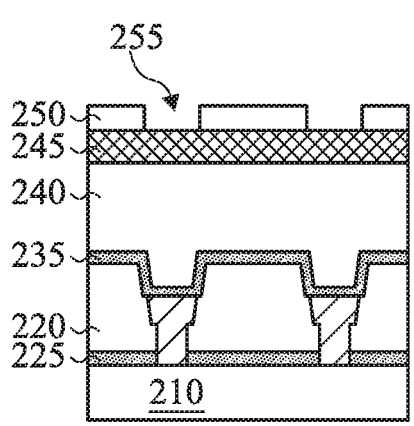

The method 100 proceeds to operation 112 to pattern the mask layer 250, thereby forming a patterned mask layer 250 having one (or more) opening 255 to define a region (or regions) for metal line (or metal lines), as illustrated in FIG. 6. The metal line refers to a metal line in an upper metal layer to be formed. In some embodiments, the mask layer 250 is a resist layer, the patterning process in the operation 112 is a lithography procedure that includes spin-on coating, exposure and developing. In some embodiments, the mask layer 250 is a hard mask, the patterning process in the operation 112 includes forming a patterned resist layer on the hard mask 250 using a lithography process; and etching the hard mask through the opening of the patterned resist layer using the patterned resist layer as an etch mask. After the formation of the patterned hard mask, the patterned resist layer may be removed by plasma ashing or wet stripping.

Figure 7:
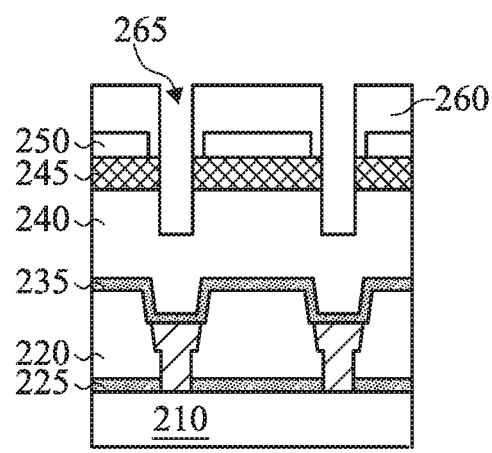
Figure 11:
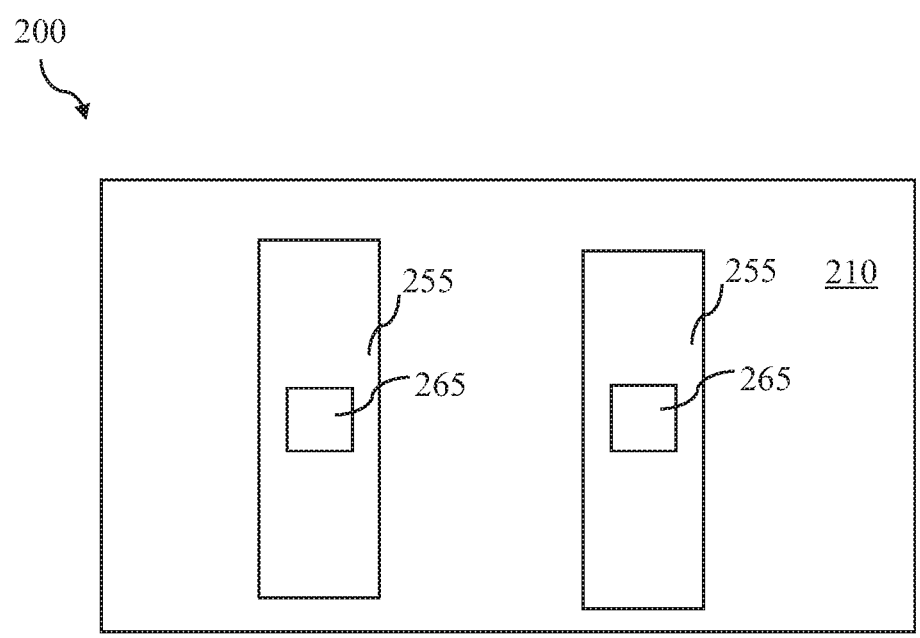
FIG. 11 illustrates a top view of the integrated circuit structure, in portion, of FIG. 4 in accordance with some embodiments.

The method 100 proceeds to operation 114 by patterning to define a via feature (or via features), as illustrated in FIG. 7. In some embodiments, a patterned resist layer 260 is formed on the IC structure 200 by a lithography process that includes spin-on coating, exposure and developing. The patterned resist layer 260 includes one (or more) opening 265 that defines a via feature. The via feature defined by the opening 265 and the metal line defined by the opening 255 are overlapped in the top view (as illustrated in FIG. 11) so that the corresponding metal line is connected with the corresponding via feature. Furthermore, the via feature defined by the opening 265 and the underlying conductive feature 215 are overlapped in the top view so that the corresponding via feature is connected with the underlying conductive feature 215.

Figure 8:
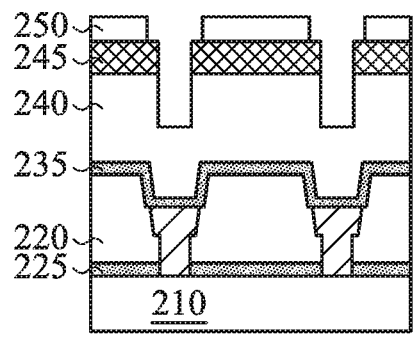

The method 100 proceeds to operation 116 for via etching, as illustrated in FIG. 7. The second dielectric material layer 240 (and the ARC layer 245 is present) is recessed through the opening 265 by a first etching process using the patterned resist layer 260 as an etch mask. The first etching process is designed and tuned to partially etch the second dielectric material layer 240 such that the recessed portion is not completely through the second dielectric material layer 240. For example, the second dielectric material layer 240 is etched to about half of its thickness. In some embodiments, the first etching process is controlled by the etching duration. Afterward, the patterned resist layer 260 is removed by plasma ashing or wet stripping, as illustrated in FIG. 8.

Figure 9:
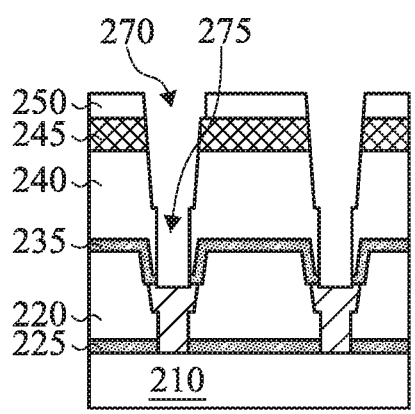

The method 100 proceeds to operation 118 for trench etching, as illustrated in FIG. 9. The second dielectric material layer 240 (and the ARC layer 245 is present) is further etched through the opening 255 of the hard mask 250 by a second etching process using the hard mask 250 as an etch mask. The second etching process is designed to selectively etch the second dielectric material layer 240 while the ESL 235 substantially remains intact. The second etching process is implemented to partially etch the second dielectric material layer 240, such as by controlling the etching duration. During the second etching process, the second dielectric material layer 240 within the region defined by the opening 255 is only recessed but not completely through the second dielectric material layer 240. However, the second dielectric material layer 240 within the region defined by the opening 265 is recessed by the first etching process and is further etched by the second etching process through the second dielectric material layer 240, therefore reaching the ESL 235. Accordingly, both the trench 270 for metal and the via (via opening) 275 for the via feature are collectively formed in the second dielectric material layer 240. The trench 270 is formed in the upper portion of the second dielectric material layer 240 and the via 275 is formed in the lower portion of the second dielectric material layer 240.

In some embodiments, the second etching process includes dry etch, wet etch or a combination thereof. The second etching process is designed with an etchant to have etching selectivity such that the second etching process substantially removes the second dielectric material layer 240 while keeps the ESL 235 intact. In some embodiments, the etchants used in the first and second etching process are same. In some embodiments, the second etching process is a dry etch with more etching directionality. In some embodiments, the etchant in the second etching process includes fluorine-containing gas (such as CxFy, which x and y are proper integers), oxygen-containing gas (such as O2), other suitable etching gas or a combination thereof.

After the formation of the trench 270 and the via 275, a third etching process, such as a wet etch, is applied to open the ESL 235. In some embodiments, the ESL 235 includes silicon nitride; and the third etching process includes phosphoric acid. In some embodiments, the ESL 235 includes silicon oxide; and the third etching process includes hydrofluoric acid.

Figure 10:
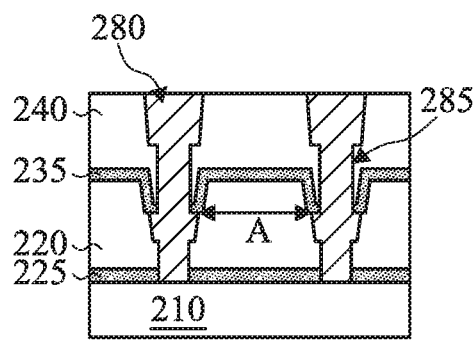

The method 100 proceeds to operation 120 to form a metal line 280 in the trench 270 and a via feature 285 in the via 275, as illustrated in FIG. 10. It is noted that the term "via 275" (or "via opening 275") refers to a void space in the second dielectric material layer and the term "via feature 285" refers to a conductive feature formed in the corresponding void space. In the operation 120, a conductive material is filled in the trench 270 and the via 275, thereby forming the metal line 280 in the trench 270 and the via feature 285 in the via 275. The via feature 285 and the metal line 280 are collectively referred to as overlying conductive feature. In various embodiments, the conductive material includes copper, aluminum, cobalt or tungsten. In some other embodiments, the conductive material may include titanium, polysilicon, metal silicide, metal alloy, or combinations thereof. In some embodiments, the overlying conductive feature is similar to the underlying conductive feature 215 in terms of composition and formation. In the present embodiment, the overlying conductive feature includes copper and has multiple films. In furtherance of the embodiment, the overlying conductive feature includes a barrier layer lining the trench and copper filled in the trench. In one example, the overlying conductive feature is formed by a procedure that includes depositing a barrier layer on sidewalls of the trench; forming a copper seed layer by sputtering; and filling the bulk copper in the trench by plating. The barrier layer may include titanium, titanium nitride, tantalum, tantalum nitride, other suitable material, or a combination thereof; and may be formed by sputtering. Afterward, a CMP process may be applied to remove excessive copper and planarize the top surface. In some embodiments, the ARC layer 245 and the hard mask 250 are removed as well by the CMP process or another etching process. In some examples, the ARC layer 245 and the hard mask 250 are removed by another etching process after the CMP process or before the CMP process.

As mentioned above, the via 275 is defined by the opening 265 of the patterned resist layer 260 using a lithography process. The opening 265 is expected to be aligned with the underlying conductive feature 215. However, the lithography process has intrinsic misalignment. When the spaces between adjacent metal lines get smaller and smaller, and the misalignment tolerances get smaller and smaller, which is a challenge to the corresponding lithography process. Furthermore, the misalignment between the metal line and the via feature may further introduce quality and reliability issues. For example, the reliability tests, such as time dependent dielectric breakdown test (TDDB), may have a concern. The disclosed method 100 provides a self-aligned process such that the misalignment between the underlying conductive feature 215 and the via feature 285 is constrained and minimized. Accordingly, the via feature 285 is self-aligned with the underlying conductive feature 215. This is explained below.

Figure 12:
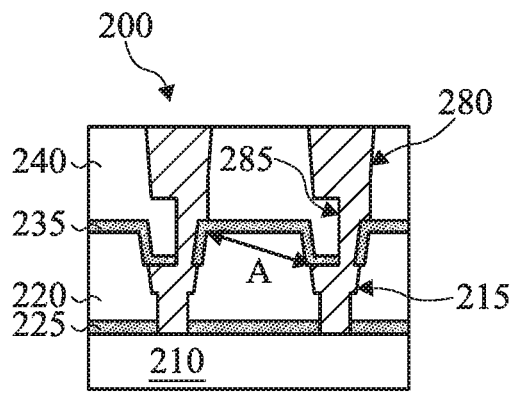
FIG. 12 illustrates a sectional view of an integrated circuit structure by the method of FIG. 1 in accordance with some embodiments.
Figure 13:
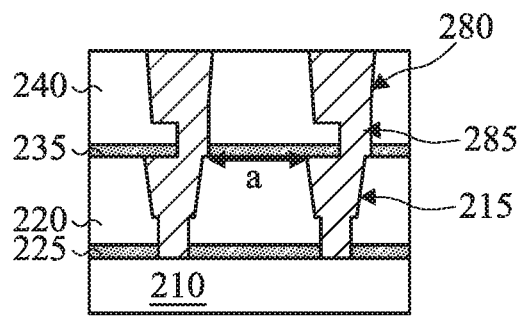
FIG. 13 illustrates a sectional view of an integrated circuit structure in accordance with some embodiments.

As illustrated in FIG. 4, the ESL 235 includes one or more dip aligned with the underlying conductive feature 215. Particularly, the dip of the ESL 235 has a bottom portion and sidewall portions. The bottom portion of the dip of the ESL 235 is substantially lower than the top surface of the top surface of the first dielectric material layer 220. This is because the underlying conductive feature 215 is recessed and the top surface of the underlying conductive feature 215 is substantially below the top surface of the first dielectric material layer 220. The sidewall portions of the dip are substantially tiled and close to the vertical direction. In the top view, the sidewall portions are substantially thicker. When a misalignment occurs, the via 275 is landing on the sidewall portions of the dip in the ESL 235. Considering the etching selectivity and the vertical thickness of the sidewall portions, the second etching process cannot etch through the sidewall portions of the dip in the ESL 235. Accordingly, the via 275 is constrained to be aligned with the underlying conductive feature 215. Furthermore, the distance between the via feature 285 and the adjacent underlying conductive feature 215 is labeled as "A" in FIG. 12, which is greater than the corresponding distance "a" in an IC structure (illustrated in FIG. 13) otherwise formed, in which the underlying conductive feature 215 is not recessed and the ESL 235 has not dip portion. Accordingly, the IC structure 200 in FIG. 12 has a better TDDB than that of FIG. 13. In FIG. 13, the corresponding features are labeled with similar numerals for easy comparison but these feature features are different from those in FIG. 12. For example, in FIG. 13, the underlying conductive feature 215 is not recessed and the ESL 235 has not dip portion.

Figure 14:
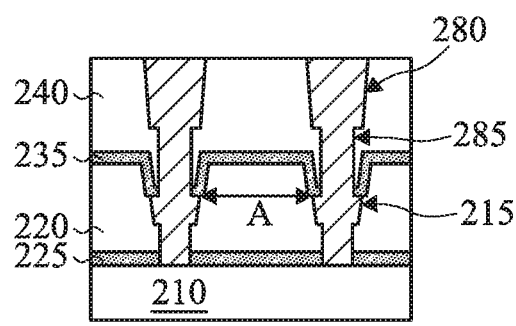
FIG. 14 illustrates a sectional view of an integrated circuit structure by the method of FIG. 1 in accordance with some embodiments.
Figure 15:
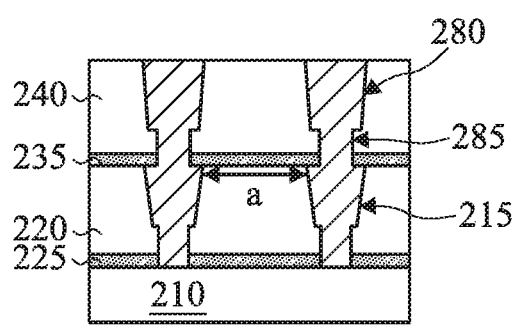
FIG. 15 illustrates a sectional view of an integrated circuit structure in accordance with some embodiments.

As a comparison, FIG. 14 illustrates the IC structure 200 formed by the method 100 and FIG. 15 illustrates an IC structure formed otherwise, in which the ESL 235 has no dip and the underlying conductive feature 215 is not recessed, constructed according to examples. In FIGS. 14 and 15, even the via features 285 are aligned with the associated underlying conductive feature 215, the IC structure 200 in FIG. 14 still gains some advantages. Due to that the underlying conductive feature 215 has less width toward the bottom and that the underlying conductive feature 215 in FIG. 14 is recessed, the distance "A" between the via feature 285 and the adjacent underlying conductive feature 215 in FIG. 14 is greater than the distance "a" between the via feature 285 and the adjacent underlying conductive feature 215 in FIG. 15.

Figure 16:
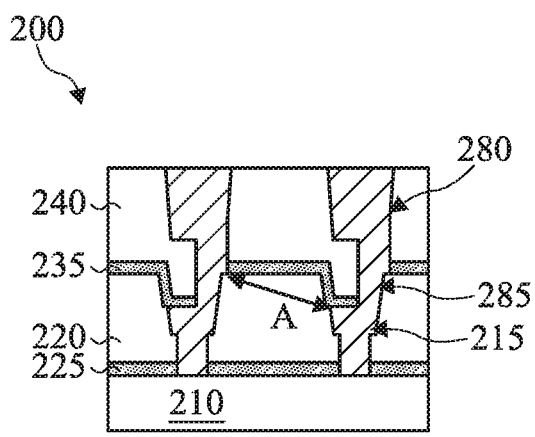
FIG. 16 illustrates a sectional view of an integrated circuit structure by the method of FIG. 1 in accordance with some embodiments.
Figure 17:
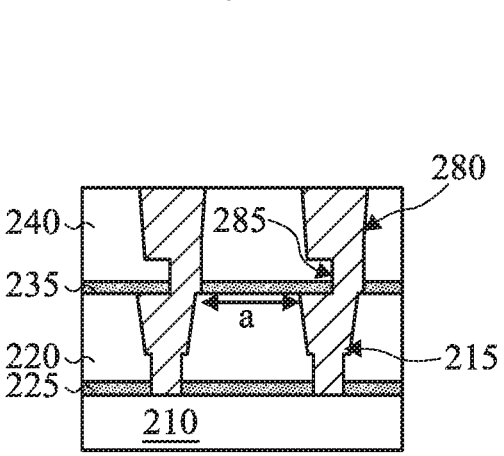
FIG. 17 illustrates a sectional view of an integrated circuit structure in accordance with some embodiments.

As another comparison, FIG. 16 illustrates the IC structure 200 formed by the method 100 and FIG. 17 illustrates an IC structure formed otherwise, in which the ESL 235 has no dip and the underlying conductive feature 215 is not recessed, constructed according to examples. In FIG. 16, even the via 285 is aligned with the associated underlying conductive feature 215 and the second etching process etches through the ESL 235, the IC structure 200 of FIG. 16 still gains some advantages. Due to that the underlying conductive feature 215 has less width toward the bottom and that the underlying conductive feature 215 in FIG. 16 is recessed, the distance "A" between the via feature 285 and the adjacent underlying conductive feature 215 in FIG. 14 is greater than the distance "a" between the via feature 285 and the adjacent underlying conductive feature 215 in FIG. 17.

The present disclosure provides an IC structure and a method making the same. Particularly, the method includes an operation to recess the underlying conductive feature. The ESL formed on the first dielectric material layer and the underlying conductive feature is not planar and has a dip portion self-aligned with the underlying conductive feature. By implementing the disclosed method in various embodiments, some of advantages described below may present. However, it is understood that different embodiments disclosed herein offer different advantages and that no particular advantage is necessarily required in all embodiments. As one example, by recessing the underlying conductive feature in the method 100, the via feature is constrained to be aligned with the underlying conductive feature. Furthermore, the distance between the via feature and the adjacent underlying conductive feature is enlarged, compared with the IC structure otherwise formed, in which the underlying conductive feature is not recessed and the ESL has not dip portion. Accordingly, the IC structure formed by the disclosed method has a better TDDB than an IC structure formed otherwise.

Other embodiments and modifications may be implemented without departing from the spirit of the present disclosure. In some examples, the underlying conductive feature 215 includes a metal line and is formed by a single damascene process. In some other examples, the underlying conductive feature 215 includes a metal line and a via feature, formed by a dual damascene process. In some embodiments, the dual damascene process to form the underlying conductive feature 215 may be similar to the dual damascene process to form the overlying conductive feature (the via feature 285 and the metal line 280). In some embodiments, the dual damascene process to form the underlying conductive feature 215 or the overlying conductive feature may be a different procedure, such as a dual damascene process with a trench-first procedure, in which, trench for metal line is patterned first and then the via for via feature is patterned afterward.

In some other embodiments, the overlying conductive feature includes via feature formed by a single damascene process. In yet some other embodiments, the overlying conductive feature includes metal line formed by a single damascene process. In this case, the operations 112 through 120 in the method 100 are replaced by a single damascene process. In a particular example, the single damascene process includes forming a patterned mask 250 as illustrated in FIG. 6. This operation is similar to the operation 112. However, the opening 255 in the patterned mask 250 may define a metal line or a via feature. The single damascene process further includes performing an etching process through the second dielectric material layer 240 using the patterned mask layer 250 as an etch mask, as illustrated in FIG. 9. This operation is similar to the operation 118. However, the etching process in the single damascene process etches from the top surface of the second dielectric material layer 240, all way down to the ESL 235, thereby forming a trench for a metal line for a via feature. Afterward, the ESL 235 may be opened by a wet etch. The single damascene process then further includes an operation to form the overlying conductive feature in the trench, as illustrated in FIG. 10. This operation is similar to the operation 120.

In the method 100, a patterning process is used to pattern various material layers, such as patterning the mask layer 250 or forming a patterned resist layer 260. In various examples, the patterning process is a lithography process that includes exposing a resist layer to a radiation beam. The radiation beam may be a photon beam. For example, the resist layer on a semiconductor wafer may be exposed to an ultraviolet (UV) light through a mask having a predefined pattern. The exposing process may be implemented using a stepper by a step-and-repeat method or using a scanner by a step-and-scan method. Other options to the radiation beam other than photon beams include electron beam and ion beam. For example, the resist layer may be exposed to an electron beam (e-beam) by an e-beam exposure system (e-beam writer). A pattern may be written to the resist layer according to a predefined pattern using the e-beam writer. The exposing process may be further extended to include other technologies such as a maskless exposing or writing process. After the exposing process, the resist layer may be is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. The lithography processes described above may only present a subset of processing steps associated with a lithography patterning technique. The lithography process may further include other steps such as cleaning and baking in a proper sequence. For example, the developed resist layer may be further baked, referred to as hard baking. The lithography processes implemented in the method may have other variations. For example, an anti-reflective coating may be disposed overlying the resist layer, referred to as top ARC (TAR). The resist may be negative type so that the PEB process may decrease the solubility of the exposed resist layer.

Thus, the present disclosure provides a method of fabricating an integrated circuit in accordance with some embodiments. The method includes providing a substrate having a first conductive feature in a first dielectric material layer; selectively etching the first conductive feature, thereby forming a recessed trench on the first conductive feature; forming an etch stop layer on the first dielectric material layer, on the first conductive feature and sidewalls of the recessed trench; forming a second dielectric material layer on the etch stop layer; forming an opening in the second dielectric material layer; and forming a second conductive feature in the opening of the second dielectric material layer. The second conductive feature is electrically connected with the first conductive feature The present disclosure also provides a method of fabricating an integrated circuit in accordance with some embodiments. The method includes providing a substrate having an underlying conductive feature embedded in a first dielectric material layer; selectively etching the underlying conductive feature, thereby forming a recessed trench in the first dielectric material layer, wherein the recessed trench is vertically aligned with the underlying conductive feature; forming an etch stop layer on the first dielectric material layer, the underlying conductive feature and sidewalls of the recessed trench; forming a second dielectric material layer on the etch stop layer; forming a first patterned mask on the second dielectric material layer, wherein the first patterned mask includes a first opening that defines a first region for an overlying conductive feature; forming a second patterned mask on the second dielectric material layer, wherein the second patterned mask includes a second opening that defines a second region for a via feature; performing a first etching process to the second dielectric material layer through the second opening of the second patterned mask, thereby recessing the second dielectric material layer within the second opening; removing the second patterned mask; performing a second etching process to the second dielectric material layer through the first opening of the first patterned mask, thereby forming a via opening in a lower portion of the second dielectric material layer and a trench in an upper portion of the second dielectric material layer; and filling in the trench and via opening with a conductive material, thereby forming a via feature in the via opening and an overlying conductive feature in the trench of the second dielectric material layer, wherein the via feature electrically connects the underlying conductive feature and the overlying conductive feature.

The present disclosure provides an integrated circuit structure in accordance with some embodiments. The integrated circuit structure includes a first dielectric material layer on a substrate; an underlying conductive feature disposed in the first dielectric material layer and recessed from a top surface of the first dielectric material layer; an etch stop layer disposed on the first dielectric material layer and the underlying conductive feature, wherein the etch stop layer has a dip portion aligned with the underlying conductive feature, and the dip portion is below a top surface of the first dielectric material layer; a second dielectric material layer disposed on the etch stop layer; and an overlying conductive feature formed in the second dielectric material layer, landing on the underlying conductive feature, and electrically connected with the underlying conductive feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a multi-layer interconnection (MLI) structure, the method comprising:
    forming a first etch stop layer over a substrate, wherein the first etch stop layer has a substantially planar top surface;
    forming a first dielectric layer over the substantially planar top surface of the first etch stop layer;
    forming a first metal line of the MLI structure in the first dielectric layer, wherein a top surface of the first metal line is lower than a top surface of the first dielectric layer, and further wherein the first metal line extends through the first etch stop layer and is connected to a conductive feature;
    forming a second etch stop layer over the top surface of the first dielectric layer and the top surface of the first metal line, such that the second etch stop layer has a non-planar top surface;
    forming a second dielectric layer disposed over the first dielectric layer and the second etch stop layer; and
    forming a second metal line of the MLI structure in the second dielectric layer, wherein the second metal line is connected to the first metal line.

2. The method of claim 1, further comprising forming a via of the MLI structure in the second dielectric layer, wherein the via connects the second metal line to the first metal line.

3. The method of claim 2, wherein:
    the second etch stop layer includes a portion that extends between the top surface of the first metal line and the top surface of the first dielectric layer; and
    the via is disposed on the portion of the second etch stop layer that extends between the top surface of the first metal line and the top surface of the first dielectric layer.

4. The method of claim 2, wherein:
    the second etch stop layer includes a portion that extends between the top surface of the first metal line and the top surface of the first dielectric layer; and
    the via is not disposed on the portion of the second etch stop layer that extends between the top surface of the first metal line and the top surface of the first dielectric layer.

5. The method of claim 2, wherein the via extends through the second etch stop layer disposed on the top surface of the first metal line and the via has a bottom surface that is lower than the top surface of the first dielectric layer.

6. The method of claim 2, wherein the forming the second metal line of the MLI structure and the via in the second dielectric layer includes:
    performing a first lithography process to form a first patterned mask layer over the second dielectric layer, wherein the first patterned mask layer has a first opening;
    performing a second lithography process to form a second patterned mask layer over the first patterned mask layer, wherein the second patterned mask layer has a second opening that overlaps the first opening and the second patterned mask layer partially fills the first opening;
    etching the second dielectric layer using the second patterned mask layer to form a trench that extends partially through the second dielectric layer;
    after removing the second patterned mask layer, etching the second dielectric layer using the first patterned mask layer, such that the trench extends through the second dielectric layer and the second etch stop layer to expose the first metal line; and
    filling the trench with a metal material.

7. The method of claim 6, wherein the trench extending through the second dielectric layer and the second etch stop layer includes an upper portion having a first width and a lower portion having a second width, wherein the first width is greater than the second width.

8. The method of claim 1, wherein the forming the first metal line of the MLI structure includes:
    performing a lithography and etching process to form a trench in the first dielectric layer that exposes the conductive feature;
    filling the trench with a metal material;
    planarizing the metal material and the first dielectric layer, such that a top surface of the metal material is substantially planar with the top surface of the first dielectric layer; and
    etching back the metal material, such that the top surface of the metal material is lower than the top surface of the first dielectric layer.

9. A method for forming a multi-layer interconnection (MLI) structure over a substrate, the method comprising:
    forming a first dielectric layer;

forming a first metal feature in the first dielectric layer, wherein the first metal feature has a first portion and a second portion, wherein the second portion is disposed over the first portion and a width of the second portion is greater than a width of the first portion;
forming an etch stop layer on the first dielectric layer;
forming a second dielectric layer on the etch stop layer, such that the etch stop layer is disposed between the first dielectric layer and the second dielectric layer; and
forming a second metal feature in the second dielectric layer, wherein the second metal feature has a third portion and a fourth portion, wherein the fourth portion is disposed over the third portion and a width of the fourth portion is greater than a width of the third portion, and further wherein:
the third portion of the second metal feature physically contacts the second portion of the first metal feature, and
the third portion of the second metal feature includes a first sidewall and a second sidewall, wherein the first dielectric layer, the etch stop layer, and the second dielectric layer directly contact the first sidewall and the etch stop layer and the second dielectric layer directly contact the second sidewall.

10. The method of claim 9, wherein the forming the first metal feature and the forming the second metal feature each include performing a dual damascene process.

11. The method of claim 9, wherein the forming the second metal feature includes:
etching a trench in the second dielectric layer that extends below a top surface of the first dielectric layer;
lining the trench with a metal barrier layer; and
filling the trench with a metal bulk layer, wherein the metal bulk layer is disposed over the metal barrier layer.

12. The method of claim 9, wherein the forming the first metal feature includes etching back the first metal feature, such that a top surface of the first metal feature is lower than the top surface of the first dielectric layer and the etch stop layer includes a portion that extends below the top surface of the first dielectric layer.

13. The method of claim 9, wherein the forming the first metal feature includes partially filling a trench with a metal material, such that a top surface of the first metal feature is lower than the top surface of the first dielectric layer and the etch stop layer includes a portion that extends below the top surface of the first dielectric layer.

14. The method of claim 9, wherein the forming the first metal feature includes selectively growing a dielectric material over the first dielectric layer, thereby increasing a thickness of the first dielectric layer, such that a top surface of the first metal feature is lower than the top surface of the first dielectric layer and the etch stop layer includes a portion that extends below the top surface of the first dielectric layer.

15. The method of claim 9, wherein the first metal feature has a thickness (T), and a ratio of a distance between a top surface of the first metal feature and a top surface of the first dielectric layer to the thickness is about 20% to about 30%.

16. A method for forming an interconnect structure, the method comprising:
forming a first dielectric layer over a substrate;
forming a metal line in the first dielectric layer, wherein a top surface of the metal line is below a top surface of the first dielectric layer, wherein the metal line is connected to an integrated circuit device feature;
forming an etch stop layer on the top surface of the first dielectric layer and a portion of the top surface of the metal line;
forming a second dielectric layer over the top surface of the first dielectric layer, wherein the etch stop layer is disposed between the first dielectric layer and the second dielectric layer; and
forming a metal via in the second dielectric layer, wherein the metal via extends through the etch stop layer to physically contact the metal line, wherein the metal via has a first sidewall and a second sidewall, wherein the second dielectric layer and the etch stop layer directly contact the first sidewall and the second sidewall, and further wherein a portion of the first sidewall directly contacted by the etch stop layer is less than a portion of the second sidewall directly contacted by the etch stop layer.

17. The method of claim 16, wherein the forming the metal line includes partially filling a trench in the first dielectric layer with a metal material, such that the top surface of the metal line is below the top surface of the first dielectric layer.

18. The method of claim 16, wherein the forming the metal line includes selectively growing a dielectric material over the first dielectric layer, thereby increasing a thickness of the first dielectric layer, such that the top surface of the metal line is below the top surface of the first dielectric layer.

19. The method of claim 16, wherein the forming the metal via includes:
performing a first lithography process to form a first patterned mask layer over the second dielectric layer, wherein the first patterned mask layer has a first opening;
performing a second lithography process to form a second patterned mask layer over the first patterned mask layer, wherein the second patterned mask layer has a second opening that overlaps the first opening and the second patterned mask layer partially fills the first opening;
etching the second dielectric layer using the second patterned mask layer to form a trench that extends partially through the second dielectric layer;
after removing the second patterned mask layer, etching the second dielectric layer using the first patterned mask layer, such that the trench extends through the second dielectric layer and the etch stop layer to expose the metal line; and
filling the trench with a metal material.

20. The method of claim 19, wherein the metal line is a first metal line and the forming the metal via also forms a second metal line, wherein the metal via connects the first metal line to the second metal line.

* * * * *